US007851372B2

United States Patent
Kang et al.

(10) Patent No.: US 7,851,372 B2
(45) Date of Patent: Dec. 14, 2010

(54) COMPOSITION FOR REMOVING AN INSULATION MATERIAL, METHOD OF REMOVING AN INSULATION LAYER AND METHOD OF RECYCLING A SUBSTRATE USING THE SAME

(75) Inventors: Dong-Min Kang, Gyeonggi-do (KR); Kui-Jong Baek, Daejeon (KR); Woong Hahn, Chungcheongnam-do (KR); Chun-Deuk Lee, Gyeonggi-do (KR); Jung-Hun Lim, Daejeon (KR); Young-Nam Kim, Gyeonggi-do (KR); Hyun-Joon Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 412 days.

(21) Appl. No.: 11/540,604

(22) Filed: Oct. 2, 2006

(65) Prior Publication Data
US 2007/0087580 A1 Apr. 19, 2007

(30) Foreign Application Priority Data
Oct. 17, 2005 (KR) .................. 10-2005-0097372

(51) Int. Cl.
*H01L 21/461* (2006.01)
(52) U.S. Cl. .................. 438/745; 438/756; 257/E21.22; 257/E21.25; 216/96; 216/103
(58) Field of Classification Search .......... 438/745, 438/756, 757; 257/E21.309, E21.25, E21.22; 216/96, 103, 104, 108, 109
See application file for complete search history.

(56) References Cited

U.S. PATENT DOCUMENTS

| 5,034,363 | A | * | 7/1991 | Petit et al. ...................... 502/61 |
| 6,017,811 | A | | 1/2000 | Winton et al. |
| RE37,972 | E | * | 2/2003 | Clark et al. ................ 29/25.01 |
| 6,890,391 | B2 | | 5/2005 | Aoki et al. |
| 6,896,744 | B2 | * | 5/2005 | Morinaga et al. ............. 134/28 |
| 7,208,325 | B2 | * | 4/2007 | Wang et al. .................... 438/4 |
| 7,479,474 | B2 | * | 1/2009 | Cernat et al. ................ 510/175 |
| 2004/0124420 | A1 | * | 7/2004 | Lin et al. ...................... 257/77 |
| 2004/0202969 | A1 | * | 10/2004 | Park et al. .................. 430/331 |
| 2005/0230351 | A1 | * | 10/2005 | Tahara ........................ 216/67 |
| 2005/0247904 | A1 | * | 11/2005 | Raj et al. ................ 252/62.9 R |
| 2007/0082497 | A1 | * | 4/2007 | Lee et al. .................... 438/745 |

FOREIGN PATENT DOCUMENTS

| JP | 2001-065459 | 3/2001 |
| JP | 2002-134468 | 5/2002 |
| JP | 2005-167181 | 6/2005 |
| KR | 1020020055888 A | 7/2002 |
| KR | 1020020081923 A | 10/2002 |
| KR | 1020040102981 A | 12/2004 |

* cited by examiner

*Primary Examiner*—Julio J Maldonado
*Assistant Examiner*—Su C Kim
(74) *Attorney, Agent, or Firm*—Volentine & Whitt, PLLC

(57) ABSTRACT

In one aspect, a composition is provided which is capable of removing an insulation material which includes at least one of a low-k material and a passivation material. The composition of this aspect includes about 5 to about 40 percent by weight of a fluorine compound, about 0.01 to about 20 percent by weight of a first oxidizing agent, about 10 to about 50 percent by weight of a second oxidizing agent, and a remaining water.

14 Claims, 5 Drawing Sheets

COMPOSITION FOR REMOVING AN INSULATION MATERIAL, METHOD OF REMOVING AN INSULATION LAYER AND METHOD OF RECYCLING A SUBSTRATE USING THE SAME

BACKGROUND OF THE INVENTION

1. Field of the Invention

Example embodiments of the present invention relate to a composition for removing an insulation material, a method of removing an insulation layer and a method of recycling a substrate using the same. More particularly, example embodiments of the present invention relate to a composition for removing an insulation material that may effectively remove a low-k film and a passivation film without damaging a substrate, and to methods of removing an insulation layer and recycling a substrate using the composition.

A claim of priority under 35 USC §119 is made to Korean Patent Application No. 2005-97372, filed on Oct. 17, 2005, the contents of which are herein incorporated by reference in their entirety.

2. Description of the Related Art

Semiconductor devices having high integration degrees and rapid response speeds are desired as information processing apparatuses have been developed. Hence, the technology of manufacturing semiconductor devices has progressed to improve integration degrees, reliability and response speeds of the semiconductor devices.

As the integration degree increases, a design rule of the semiconductor device has been reduced. For example, a wiring having a width of about 100 nm or less has been developed. As the design rule of the semiconductor device is reduced, a RC delay time of the wiring has increased. The RC delay time is determined by a resistance (R) of the wiring and a capacitance (C) of an insulation layer between the wirings. An increase in the RC delay time shortens the response time. Therefore, reducing the resistance of the wiring or a dielectric constant (k) of the insulation layer is required for obtaining a semiconductor device having high integration degree and rapid response time.

In order to reduce the resistance of the wiring, a conductive material having a low resistivity has been developed. For example, a process of forming a wiring using copper having a resistivity which is substantially lower than that of aluminum has been developed.

In order to reduce the dielectric constant of the insulation layer, an insulation material having a low dielectric constant is required. In a conventional semiconductor device, the insulation layer is generally formed using silicon oxide having a dielectric constant of about 3.9. As a thickness of the insulation layer is reduced, the insulation layer formed using silicon oxide does not effectively isolate adjacent wirings from each other, and a parasitic capacitance between the adjacent wirings increases. Therefore, low-k materials having a dielectric constant which is substantially lower than that of silicon oxide have been developed in the semiconductor manufacturing industry.

The low-k material generally has a dielectric constant lower than or equal to about 3. Low-k materials are largely divided into organic low-k materials and inorganic low-k materials. However, organic low-k materials are primarily used. Examples of the organic low-k material include carbon-doped silicon oxide (SiOCH), silicon oxycarbide (SiOC), hydrogenated silicon oxide (SiOH), black diamond, methylsilsesquioxane (MSQ), fluorinated silicate glass (FSG) and organic silicate glass (OSG).

When the insulation layer is formed using the low-k material, the insulation layer may be easily damaged by plasma in a subsequent dry etching process. Furthermore, the insulation layer formed using the low-k material may have porosity. A porous insulation layer easily absorbs moisture through pores so that the porous insulation layer may be deteriorated. Thus, a passivation layer is generally formed on the insulation layer to prevent deterioration of the insulation layer. The passivation layer may be formed using silicon carbonitride (SiCN), silicon nitride (SiN) or silicon carbide (SiC). The passivation layer may be used as a capping layer formed on a conductive material.

Various processes are generally performed for manufacturing a semiconductor device. An inspection process is performed between processes to check a processed wafer. For example, when processing a wafer, a dummy wafer is also introduced in each process. After each process is performed, a thickness of a layer and characteristics of the layer are estimated using the dummy wafer.

While the once-used dummy wafer may be discarded, it is preferable for economic reasons to recycle the dummy wafer. As a wafer having a diameter of about 300mm has recently been used in a semiconductor manufacturing process, the desire to recycle and reuse the dummy wafer has increased.

In forming of the low-k layer and/or the passivation layer, the dummy wafer is used along with the processing wafer. After the inspection process is performed on the dummy wafer, the low-k layer and/or the passivation layer are advantageously removed from the dummy wafer.

The low-k layer and/or the passivation layer are generally removed by a dry etching process or a wet etching process. The dry etching process is performed using plasma and the wet etching process is performed using an etching solution. For example, U.S. Pat. No. 6,890,391 discloses a method of removing a low-k layer and a passivation layer using a dry etching process. In the method, the low-k layer is formed using silicon oxide, methylsilsesquioxane (MSQ), hydrosilsesquioxane (HSQ), silicon oxycarbide (SiOC) or carbon-doped silicon oxide (SiOCH), and the passivation layer is formed using silicon nitride (SiN) or silicon carbonitride (SiCN). Japanese Laid-Open Patent Publication No. 2001-65459 discloses a method of dry etching a low-k layer including silicon oxycarbide (SiOC) using a mixture gas including a fluorinated carbon gas, nitrogen gas, and an inert gas having at least about 80% of a flow rate based on the total gas flow rate. In addition, Korean Laid-Open Patent Publication No. 2004-102981 discloses a method of removing an insulating interlayer through a plasma etching process using a mixture gas of $CF_4$, $O_2$ and Ar. In the method, the insulating interlayer includes an oxide layer, an organic low-k layer, an organic porous low-k layer or a combination thereof.

In the above methods of removing the low-k layer and/or a passivation layer through a dry etching process, plasma having a high energy can cause damage to an underlying layer. Furthermore, recycling the dummy wafer using the dry etching process is not economically advantageous.

Korean Laid-Open Patent Publication No. 2002-55888 discloses a method of manufacturing a metal wiring and a capacitor in a semiconductor device. In the method, an insulation layer formed using silicon oxide, fluorinated silicate glass (FSG), carbon-doped silicon oxide (SiOCH), silicon oxycarbide (SiOC) or hydrogenated silicon oxide (SiOH), is removed using a hydrofluoric acid solution. However, the hydrofluoric acid solution does not sufficiently remove the low-k material from an object. Furthermore, the hydrofluoric acid solution only minimally etches a passivation material such as silicon carbonitride (SiCN).

Japanese Laid-Open Patent Publication No. 2005-167181 discloses a method of selectively etching a low-k layer that includes black diamond. In the method, the low-k layer is removed using an etching solution that includes about 0.5 to about 20 percent by weight of hydrofluoric acid and/or a salt thereof, about 60 to about 99.5 percent by weight of sulfuric acid and about 0 to about 20 percent by weight of water. The etching solution is reported to effectively remove the low-k layer. However, the etching solution includes an excessive amount of sulfuric acid so that an etching rate is not easily controlled, and a substrate such as a silicon wafer may be damaged.

SUMMARY OF THE INVENTION

According to one aspect of the present invention, a composition is provided which is capable of removing an insulation material which includes at least one of a low-k material and a passivation material. The composition includes about 5 to about 40 percent by weight of a fluorine compound, about 0.01 to about 20 percent by weight of a first oxidizing agent, about 10 to about 50 percent by weight of a second oxidizing agent, and a remaining water.

According to another aspect of the present invention, a composition is provided which is capable of removing an insulation material which includes at least one of a low-k material and a passivation material. The composition includes about 5 to about 20 percent by weight of a first fluorine compound including hydrogen fluoride, about 1 to about 20 percent by weight of a second fluorine compound including at least one selected from the group consisting of ammonium fluoride, ammonium hydrogen difluoride, ammonium fluoroborate, boron trifluoride, fluoroboric acid, hydrosilicofluoric acid, potassium hydrogen difluoride, sodium fluoride, sodium hydrogen difluoride, barium fluoride and potassium fluoride, about 0.01 to about 20 percent by weight of a first oxidizing agent including hydrogen peroxide, about 10 to about 50 percent by weight of a second oxidizing agent including sulfuric acid, and a remaining water.

According to still another aspect of the present invention, a method is provided of removing an insulation layer from an object, where the insulating layer includes at least one of a low-k material and a passivation material. The method includes providing a composition which includes about 5 to about 40 percent by weight of a fluorine compound, about 0.01 to about 20 percent by weight of a first oxidizing agent, about 10 to about 50 percent by weight of a second oxidizing agent, and a remaining water, and applying the composition to the insulation layer to remove the insulation layer.

According to still another aspect of the present invention, a method is provided of recycling a substrate. The method includes forming an insulation layer on the substrate, the insulation layer including at least one of a low-k material and a passivation material, and removing the insulation layer from the substrate by applying a composition to the insulation layer, where the composition includes about 5 to about 40 percent by weight of a fluorine compound, about 0.01 to about 20 percent by weight of a first oxidizing agent, about 10 to about 50 percent by weight of a second oxidizing agent, and a remaining water.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF EMBODIMENTS

Figure 1:
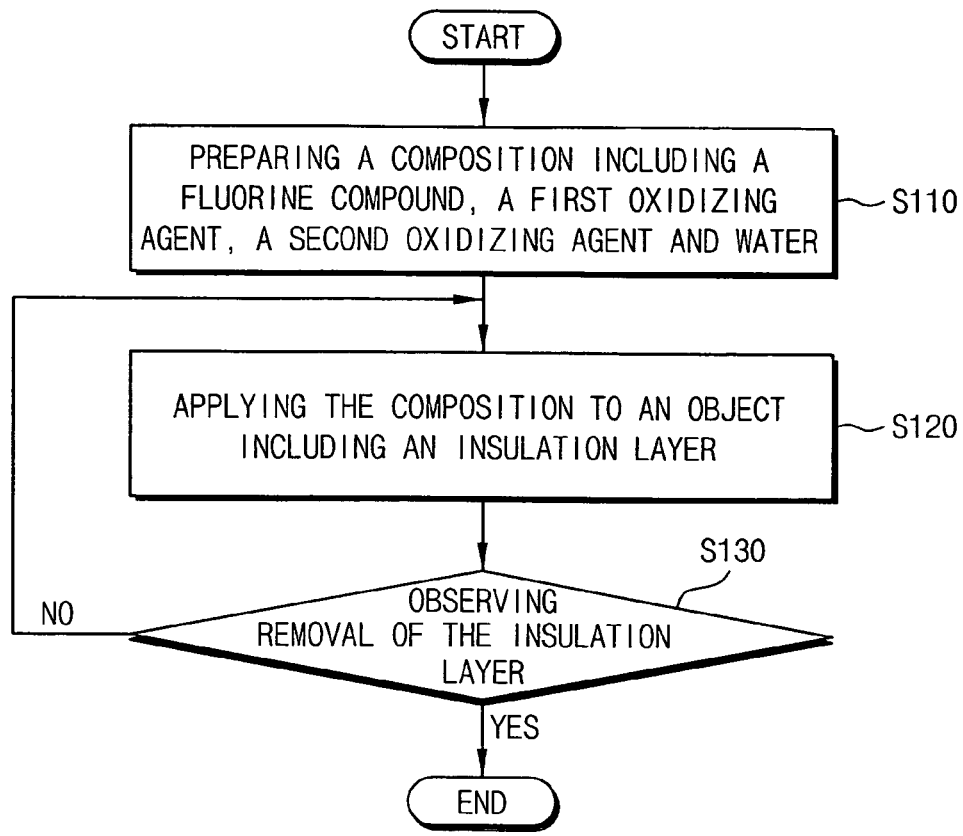
FIG. 1 is a flow chart illustrating a method of removing an insulation layer from a substrate by using a composition in accordance with an example embodiment of the present invention.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Composition for Removing an Insulation Material

A composition for removing an insulation material, according to the present invention, may remove an insulation layer from a substrate without damaging the substrate. In particular, the composition may effectively remove a low-k film and/or a passivation film from the substrate without damaging the substrate. The low-k film may be formed using a low-k material such as, for example, carbon-doped silicon oxide (SiOCH), silicon oxycarbide (SiOC) and hydrogenated silicon oxide (SiOH). The passivation film may be formed using a passivation material such as, for example, silicon carbonitride (SiCN), silicon nitride (SiN) and silicon carbide (SiC).

The composition of the present invention having the above characteristics includes about 5 to about 40 percent by weight of a fluorine compound, about 0.01 to about 20 percent by weight of a first oxidizing agent, about 10 to about 50 percent by weight of a second oxidizing agent, and a remaining water.

The fluorine compound included in the composition of the present invention may remove an insulation material such as a low-k material and/or a passivation material from an object. In particular, the insulation material may be reacted with the first and the second oxidizing agents to form silicon oxide. The fluorine compound may be reacted with silicon oxide to decompose silicon oxide into easily removable substances. For example, hydrogen fluoride is reacted with silicon oxide as shown in the following chemical equation 1.

$$6HF + 2SiO_2 \rightarrow Si_2F_6O + 3H_2O \qquad (1)$$

When the composition of the present invention includes less than about 5 percent by weight of the fluorine compound, the composition may exhibit a substantially reduced removal ability of the insulation material, and a process time may take longer. In addition, when the content of the fluorine compound is greater than about 40 percent by weight, a substrate such as a silicon wafer may be damaged. Thus, the composition of the present invention includes about 5 to about 40 percent by weight of the fluorine compound, preferably, about 5 to about 30 percent by weight of the fluorine compound.

Examples of the fluorine compound that may be used in the composition of the present invention may include hydrogen fluoride (HF), ammonium fluoride ($NH_4F$), ammonium hydrogen difluoride ($NH_4HF_2$), ammonium fluoroborate ($NH_4BF_4$), boron trifluoride ($BF_3$), fluoroboric acid ($HBF_4$), hydrosilicofluoric acid ($H_2SiF_6$), potassium hydrogen difluoride ($KHF_2$), sodium fluoride ($NaHF_2$), sodium hydrogen difluoride ($NaHF_2$), barium fluoride ($BaF_2$), and potassium fluoride (KF). These can be used individually or in a mixture of two or more thereof.

In an example embodiment of the present invention, the composition may include a first fluorine compound having hydrogen fluoride, and a second fluorine compound. Examples of the second fluorine compound may include ammonium fluoride, ammonium hydrogen difluoride, ammonium fluoroborate, boron trifluoride, fluoroboric acid, hydrosilicofluoric acid, potassium hydrogen difluoride, sodium fluoride, sodium hydrogen difluoride, barium fluoride, and potassium fluoride. These can be used individually or a combination of two or more thereof. The first fluorine compound may remove the insulation material such as silicon carbonitride, and the second fluorine compound may maintain the removal ability of the composition for the insulation material, although the content of the first fluorine compound may be reduced with the passage of a process time.

When the composition according to an example embodiment of the present invention includes less than about 5 percent by weight of the first fluorine compound, an etching rate of silicon carbonitride may be unpreferably reduced. In addition, when the content of the first fluorine compound is greater than about 20 percent by weight, the etching rate of silicon carbonitride may be enhanced, but a silicon wafer may be damaged. Thus, the composition may preferably include about 5 to about 20 percent by weight of the first fluorine compound, more preferably, about 5 to about 15 percent by weight of the first fluorine compound based on a total weight of the composition.

When the composition according to an example embodiment of the present invention includes less than about 1 percent by weight of the second fluorine compound, the second fluorine compound may not sufficiently compensate a gradual reduction of the first fluorine compound in a process, thus the removal ability of the composition may be unpreferably deteriorated. In addition, when the content of the second fluorine compound is greater than about 20 percent by weight, the second fluorine compound may not be completely dissolved in the composition and the etching rate of silicon carbonitride may not be enhanced any further, which is considered to be economically unpreferable. Thus, the composition may preferably include about 1 to about 20 percent by weight of the second fluorine compound, more preferably, about 3 to about 15 percent by weight of the second fluorine compound based on a total weight of the composition.

The composition of the present invention includes a first oxidizing agent and a second oxidizing agent. The first and the second oxidizing agents may be reacted with the low-k material such as SiOCH, SiOC, SiOH, etc. and/or the passivation material such as SiCN, SiN, SiC, etc. to generate silicon oxide. For example, the oxidizing agent is reacted with silicon carbonitride as shown in the following chemical equation 2.

$$\text{SiCN} + \text{Oxidizing Agent} \rightarrow \text{SiO}_2 + \text{Byproducts} \qquad (2)$$

The oxidizing agent is reacted with silicon carbonitride to generate silicon oxide and byproducts. The byproducts may be easily removed from the substrate.

The first oxidizing agent included in the composition of the present invention may oxidize the insulation material into silicon oxide so that the first oxidizing agent may serve to remove of the insulation material.

When the composition of the present invention includes less than about 0.01 percent by weight of the first oxidizing agent, the composition may not have sufficient oxidizing ability and an etching rate of silicon carbonitride may decrease. In addition, when the content of the first oxidizing agent is greater than about 20 percent by weight, an etching selectivity of silicon carbonitride relative to silicon may be reduced so that the composition may not selectively remove silicon carbonitride without damaging a silicon wafer. Thus, the composition of the present invention includes about 0.01 to about 20 percent by weight of the first oxidizing agent, preferably, about 0.1 to about 15 percent by weight of the first oxidizing agent.

Examples of the first oxidizing agent, which may be used in the composition of the present invention, may include hydrogen peroxide, nitric acid, perchloric acid, fuming sulfuric acid, potassium permanganate and sodium hypochlorite. These can be used individually or in a mixture of two or more thereof.

The second oxidizing agent included in the composition of the present invention may oxidize the insulation material into silicon oxide. Furthermore, the second oxidizing agent may sufficiently reduce a pH value of the composition to below about 2, and thus a difference of zeta potential between silicon carbonitride and silicon may increase. As a result, the composition may selectively remove silicon carbonitride from silicon.

When the composition of the present invention includes less than about 10 percent by weight of the second oxidizing agent, the difference of zeta potential between silicon carbonitride and silicon may be so small that the composition may not selectively remove silicon carbonitride from a silicon wafer. In addition, when the content of the second oxidizing agent is greater than about 50 percent by weight, heat resulting from mixing of the fluorine compound, the first oxidizing agent and the second oxidizing agent may be so great that a substrate may be damaged. Thus, the composition of the present invention includes about 10 to about 50 percent by weight of the second oxidizing agent, preferably, about 20 to about 40 percent by weight of the second oxidizing agent.

Examples of the second oxidizing agent, which may be used in the composition of the present invention, may include an inorganic acid and/or an organic acid. Particularly, examples of the inorganic acid may include sulfuric acid, hydrochloric acid and phosphoric acid. These can be used individually or in a mixture of two or more thereof. Examples of the organic acid may include acetic acid, propionic acid, butyric acid, oxalic acid, malonic acid, maleic acid, succinic acid, glutaric acid, adipic acid, phthalic acid and fumaric acid. These can be used individually or in a mixture of two or more thereof.

In an example embodiment of the present invention, the composition may include the inorganic acid and the organic acid as the second oxidizing agents. For example, the composition including sulfuric acid and acetic acid as the second oxidizing agents may have an etching rate of silicon carbonitride twice as high as that of the composition including only sulfuric acid.

The composition of the present invention includes water. Examples of water may include pure water, deionized water and ultra pure water. These can be used individually or in a mixture of two or more thereof.

In an example embodiment of the present invention, the composition may further include a stabilizing agent. The stabilizing agent may prevent a gradual decrease of removal ability of the composition with the passage of a process time, and thus may enhance the stability of the composition.

When the composition according to an example embodiment of the present invention includes less than about 1 percent by weight of the stabilizing agent, the composition may not have sufficient stability. In addition, when the content of the stabilizing agent is greater than about 20 percent by weight, stability of the composition may not greatly increase any further, which is considered to be unpreferable. Thus, the composition may include preferably about 1 to about 20 percent by weight of the stabilizing agent, more preferably, about 1 to about 10 percent by weight of the stabilizing agent.

Examples of the stabilizing agent, which may be used in the composition in accordance with an example embodiment of the present invention, may include an amide compound, an amine compound or a combination thereof. Examples of the amide compound may include carbamide, acetamide or a combination thereof. Examples of the amine compound may include methylamine, diethylamine, n-decylamine, morpholine, allylamine, triethylenediamine, dimethylcyclohexylamine, triethylamine and dimethylethanolamine. These can be used individually or in a mixture of two or more thereof.

The composition of the present invention is used for removing a low-k material and/or a passivation material. Examples of the low-k material may include carbon-doped silicon oxide (SiOCH), silicon oxycarbide (SiOC), hydrogenated silicon oxide (SiOH) or a combination of two or more thereof. Particularly, the composition of the present invention may effectively remove carbon-doped silicon oxide.

Examples of the passivation material may include silicon carbonitride (SiCN), silicon nitride (SiN), silicon carbide (SiC) or a combination of two or more thereof.

It is noted here that silicon carbonitride (SiCN) in particular is conventionally removed by a dry etching process. In contrast, the composition of the present embodiments may be advantageously utilized in a wet etching process to silicon carbonitride (SiCN).

In an example embodiment of the present invention, the composition for removing an insulation material may include about 5 to about 20 percent by weight of a first fluorine compound including hydrogen fluoride, about 1 to about 20 percent by weight of a second fluorine compound including ammonium fluoride, ammonium hydrogen difluoride, ammonium fluoroborate, boron trifluoride, fluoroboric acid, hydrosilicofluoric acid, potassium hydrogen difluoride, sodium fluoride, sodium hydrogen difluoride, barium fluoride, potassium fluoride or a combination of two or more thereof, about 0.01 to about 20 percent by weight of a first oxidizing agent including hydrogen peroxide, about 10 to about 50 percent by weight of a second oxidizing agent including sulfuric acid, and water. The composition may be used for removing an insulation material such as a low-k material and/or a passivation material. For example, the composition may effectively remove an insulation material including silicon carbonitride.

The first oxidizing agent may further include, for example, one or more of nitric acid, perchloric acid, fuming sulfuric acid, potassium permanganate and sodium hypochlorite, together with hydrogen peroxide. In addition, the second oxidizing agent may further include an organic acid such as one or more of acetic acid, propionic acid, butyric acid, oxalic acid, malonic acid, maleic acid, succinic acid, glutaric acid, adipic acid, phthalic acid and fumaric acid, together with sulfuric acid. The composition may further include a stabilizing agent such as an amide compound, an amine compound or a combination thereof. When the composition includes the stabilizing agent, the composition may include about 5 to about 20 percent by weight of the first fluorine compound, about 1 to about 20 percent by weight of the second fluorine compound, about 0.01 to about 20 percent by weight of the first oxidizing agent including hydrogen peroxide, about 10 to about 50 percent by weight of the second oxidizing agent, about 1 to about 20 percent by weight of the stabilizing agent and a remaining water. The insulation material, the first and the second fluorine compound, the first and the second oxidizing agent, the stabilizing agent and water are previously described, so any further explanation thereof is omitted here to avoid redundancy.

Method of Removing an Insulation Layer

FIG. 1 is a flow chart illustrating a method of removing an insulation layer from a substrate by using a composition in accordance with an example embodiment of the present invention.

Referring to FIG. 1, the composition according to the above-described embodiments of the present invention is prepared at stetp S110. The composition may include about 5 to about 40 percent by weight of a fluorine compound, about 0.01 to about 20 percent by weight of a first oxidizing agent, about 10 to about 50 percent by weight of a second oxidizing agent, and a remaining water.

The composition may be prepared by mixing about 5 to about 40 percent by weight of a fluorine compound, about 0.01 to about 20 percent by weight of a first oxidizing agent, about 10 to about 50 percent by weight of a second oxidizing agent, and a remaining water using a stirrer or a circulation system.

The insulation layer formed using a low-k material and/or a passivation material is removed from an object by applying the composition to the object in step S120.

Examples of the low-k material may include carbon-doped silicon oxide (SiOCH), silicon oxycarbide (SiOC), hydrogenated silicon oxide (SiOH) or a combination thereof. Examples of the passivation material may include silicon carbonitride (SiCN), silicon nitride (SiN), silicon carbide (SiC) or a combination thereof. In addition, examples of the object may include a substrate or a substrate on which a lower structure is formed. Examples of the substrate may include a silicon wafer or a silicon-on-insulator (SOI) substrate. Examples of the lower structure may include a gate, a wiring, a capacitor, a contact, a pad or a plug.

The insulation layer may include a low-k film including the low-k material, a passivation film including the passivation material or a multi-layered film thereof. In an example embodiment of the present invention, the insulation layer may include a low-k film and a passivation film formed on the low-k film. For example, the insulation layer includes a low-k film formed using carbon-doped silicon oxide (SiOCH) and a passivation film formed on the low-k film using silicon carbonitride (SiCN). When the composition of the present invention is applied to the object including the insulation layer thereon, the fluorine compound, the first oxidizing agent and the second oxidizing agent may be reacted with the low-k material and the passivation material to simultaneously remove the low-k film and the passivation film from the object.

Particularly, the first and the second oxidizing agents included in the composition may be reacted with the low-k material and the passivation material to generate silicon oxide. In addition, the fluorine compound included in the composition may decompose the generated silicon oxide and remove the same from the object. As a result, the insulation layer is removed from the object.

The composition may be applied to the object using a batch-type etching apparatus or a single-type etching apparatus.

When the temperature of the composition applied to the object is lower than about 40° C., a process time needed for removing the insulation layer may excessively increase. In addition, when the temperature of the composition is higher than about 90° C., an etching rate of the insulation layer may not be easily controlled and the object such as a silicon wafer may be damaged by the composition. Therefore, the composition applied to the object may preferably have a temperature of about 40° C. to about 90° C., more preferably, about 50° C. to about 70° C.

It may be observed using naked eye observation and/or an electronic microscope whether the insulation layer has been completely removed from the object in step S130. When the insulation layer is not completely removed from the object, the composition is applied to the object again to completely remove the insulation layer from the object.

Method of Recycling a Substrate

Figure 2:
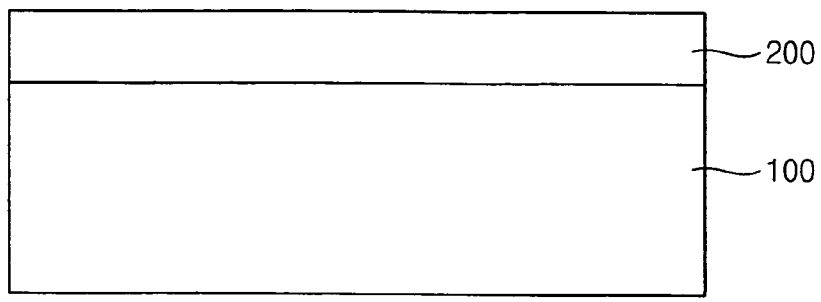
FIGS. 2 to 4 are cross-sectional views illustrating a method of recycling a substrate by using a composition in an example embodiment of the present invention.
Figure 3:
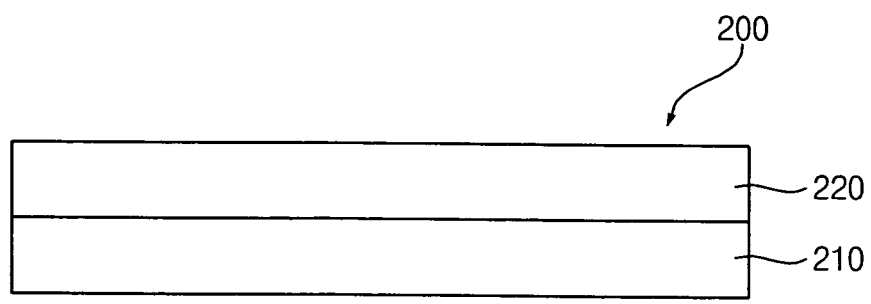
Figure 4:
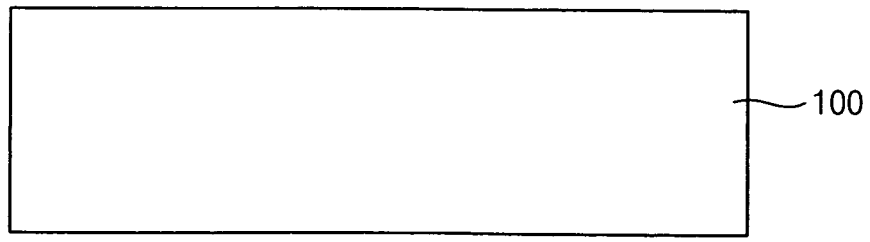

FIGS. 2 to 4 are cross-sectional views for use in describing a method of recycling a substrate using a composition in an example embodiment of the present invention.

FIG. 2 is a cross-sectional view illustrating an insulation layer 200 formed on a substrate 100. FIG. 3 is a cross-sectional view illustrating the insulation layer 200 in FIG. 2.

Referring to FIG. 2, the insulation layer 200 is formed on the substrate 100. Examples of the substrate may include a silicon wafer or a silicon-on-insulator (SOI) substrate.

The insulation layer 200 may include a low-k film, a passivation film or a multi-layered film thereof. The low-k film may be formed, for example, using a low-k material such as carbon-doped silicon oxide (SiOCH), silicon oxycarbide (SiOC) or hydrogenated silicon oxide (SiOH). The passivation film may be formed using a passivation material such as silicon carbonitride (SiCN), silicon nitride (SiN) or silicon carbide (SiC).

Referring to FIG. 3, in the example of this embodiment, the insulation layer 200 includes a low-k film 210 formed on the substrate 100 and a passivation film 220 formed on the low-k film 210. Also in the example of this embodiment, the the low-k film 210 is formed using carbon-doped silicon oxide (SiOCH) and the passivation film 220 is formed on the low-k film 210 using silicon carbonitride (SiCN).

FIG. 4 is a cross-sectional view illustrating substrate 100 after removal of the insulation layer 200 using the composition of embodiments of the present invention. As explained previously, the composition may include about 5 to about 40 percent by weight of a fluorine compound, about 0.01 to about 20 percent by weight of a first oxidizing agent, about 10 to about 50 percent by weight of a second oxidizing agent, and a remaining water.

When the composition of embodiments of the present invention is applied to the substrate 100 including the insulation layer 200 thereon, the first and the second oxidizing agents included in the composition may be reacted with the low-k material and the passivation material to generate silicon oxide. In addition, the fluorine compound included in the composition may decompose the generated silicon oxide so that the insulation layer 200 is removed from the substrate 100.

When the insulation layer 200 includes the low-k film 210 and the passivation film 220 formed on the low-k film 210 according to an example embodiment of the present invention, the low-k film 210 and the passivation film 220 are simultaneously removed from the substrate 100.

Additionally, the substrate 100 may be rinsed using pure water so that any remaining composition and other residuals may be removed from the substrate 100. Further, the substrate 100 may be dried so that any remaining water may be removed from the substrate 100.

The substrate 100 may be economically recycled by removing the insulation layer 200 from the substrate 100 using the composition of embodiments of the present invention. The insulation layer 200 may be removed by a wet etching process so that damage to the substrate 100 otherwise generated in a dry etching process may be prevented. Therefore, the cost associated with the semiconductor manufacturing process may be reduced and process efficiency may be enhanced.

The composition for removing an insulation material according to embodiments of the present invention will be further described hereinafter with reference to Examples and Comparative Examples.

Preparation of a Composition for Removing an Insulation Material

EXAMPLE 1

A composition for removing an insulation material was prepared by mixing about 10 percent by weight of hydrogen fluoride (HF), about 5 percent by weight of ammonium hydrogen difluoride ($NH_4HF_2$), about 10 percent by weight of hydrogen peroxide ($H_2O_2$), about 0.7 percent by weight of nitric acid ($HNO_3$), about 30 percent by weight of sulfuric acid ($H_2SO_4$), about 10 percent by weight of acetic acid ($CH_3COOH$), about 3 percent by weight of carbamide and a remainder of pure water, based on a total weight of the composition. The composition thus obtained had a pH of about 2.

EXAMPLES 2 TO 13

Compositions for removing an insulation material were prepared by processes substantially the same as those of Example 1 except for the types and contents of the first and the second oxidizing agents, and except for the presence or absence of the stabilizing agent. The components in the compositions are shown in Table 1. All the compositions thus obtained had a pH of about 2.

COMPARATIVE EXAMPLES 1 TO 3

Compositions for removing an insulation layer were prepared by processes substantially the same as those of Example 1 except for presence or absence of the first and the second oxidizing agents, and the types and contents of the fluorine compound and the first and the second oxidizing agents. The components in the compositions are shown in Table 1.

COMPARATIVE EXAMPLE 4

Conventionally used Kallings reagent was prepared by mixing about 2 g of copper chloride ($CuCl_2$), about 40 mL of hydrochloric acid (HCl), about 40 mL of ethanol and about 40 mL of distilled water.

COMPARATIVE EXAMPLE 5

Conventionally used Marble's reagent was prepared by mixing about 10 g of copper sulfate ($CuSO_4$), about 50 mL of hydrochloric acid (HCl) and about 50 mL of distilled water.

COMPARATIVE EXAMPLE 6

Conventionally used Murakami reagent was prepared by mixing about 10 g of sodium hydroxide (NaOH), about 10 g of potassium ferricyanide ($K_3Fe(CN)_6$) and about 100 mL of distilled water.

COMPARATIVE EXAMPLE 7

Conventionally used Vilella's reagent was prepared by mixing about 45 mL of glycerol, about 15 mL of nitric acid ($HNO_3$) and about 30 mL of hydrofluoric acid (HCl).

TABLE 1

| | Fluorine compound [wt %] | | First Oxidizing Agent [wt %] | | Second Oxidizing Agent [wt %] | | Stabilizing Agent [wt %] |
|---|---|---|---|---|---|---|---|
| | HF | $NH_4HF_2$ | $H_2O_2$ | $HNO_3$ | $H_2SO_4$ | $CH_3COOH$ | Carbamide |
| Example 1 | 10 | 5 | 10 | 0.7 | 30 | 10 | 3 |
| Example 2 | 10 | 5 | 10 | 0.7 | 40 | — | 3 |
| Example 3 | 10 | 5 | 10 | 1 | 30 | 10 | 3 |
| Example 4 | 10 | 5 | 10 | 0.5 | 30 | 10 | 3 |
| Example 5 | 10 | 5 | 10 | — | 30 | 10 | 3 |
| Example 6 | 10 | 5 | 5 | 0.7 | 30 | 10 | 3 |
| Example 7 | 10 | 5 | 5 | 0.5 | 30 | 10 | 3 |
| Example 8 | 10 | 5 | 5 | 0.3 | 30 | 10 | 3 |
| Example 9 | 10 | 5 | 5 | — | 30 | 10 | 3 |
| Example 10 | 10 | 5 | 10 | 0.7 | 30 | 10 | — |
| Example 11 | 10 | 5 | — | 1 | 30 | 10 | 3 |

TABLE 1-continued

|  | Fluorine compound [wt %] | | First Oxidizing Agent [wt %] | | Second Oxidizing Agent [wt %] | | Stabilizing Agent [wt %] |
| --- | --- | --- | --- | --- | --- | --- | --- |
|  | HF | NH$_4$HF$_2$ | H$_2$O$_2$ | HNO$_3$ | H$_2$SO$_4$ | CH$_3$COOH | Carbamide |
| Example 12 | 10 | 5 | — | 0.7 | 30 | 10 | 3 |
| Example 13 | 10 | 5 | — | 0.3 | 30 | 10 | 3 |
| Comparative Example 1 | 10 | — | — | — | 80 | — | — |
| Comparative Example 2 | 10 | — | 5 | — | 80 | — | — |
| Comparative Example 3 | 50 | — | — | — | — | — | — |

Evaluation of an Etching Rate of an Insulation Layer

Etching rates of insulation layers were evaluated for the compositions prepared in Examples 1 to 10 and Comparative Examples 1 to 7.

A low-k film and a passivation film were used as the insulation layers. To evaluate an etching rate of the low-k film, a carbon-doped silicon oxide (SiOCH) film having a thickness of about 4,900 Å was formed on a bare silicon wafer. To evaluate an etching rate of the passivation film, a silicon carbonitride (SiCN) film having a thickness of about 3,200 Å was formed on a bare silicon wafer.

Each of the compositions prepared in Examples 1 to 10 and Comparative Examples 1 to 7 was poured in a 500 mL beaker, and the compositions were maintained at a temperature of about 60° C. using a thermostat. The silicon wafers, on which the carbon-doped silicon oxide (SiOCH) film or the silicon carbonitride (SiCN) film was formed, were immersed in the compositions, respectively. The silicon wafers were rinsed using ultra pure water. The silicon wafers were completely dried using nitrogen gas. The etching rates of the carbon-doped silicon oxide (SiOCH) film and the silicon carbonitride (SiCN) film were calculated by measuring time needed for complete removal. Confirmation of whether the carbon-doped silicon oxide (SiOCH) film and the silicon carbonitride (SiCN) film were completely removed was performed using naked eye observation, a thin film thickness measurement and a scanning electron microscope (SEM). A spectroscopic ellipsometer MG-1000 (trade name; manufactured by Nanoview Co., Ltd., Republic of Korea) was used as the thin film thickness measurement, and S-4700 (trade name; manufactured by Hitachi Co., Ltd., Japan) was used as the SEM. The etching rates of the carbon-doped silicon oxide (SiOCH) film and the silicon carbonitride (SiCN) film are shown in Table 2.

TABLE 2

|  | Etching Rate of SiCN Film [Å/min] | Etching Rate of SiOCH Film [Å/min] |
| --- | --- | --- |
| Example 1 | 25.16 | 9,800 |
| Example 2 | 13.4 | 4,900 |
| Example 3 | 25 | — |
| Example 4 | 22.13 | — |
| Example 5 | 17.21 | — |
| Example 6 | 22.45 | — |
| Example 7 | 23.52 | — |
| Example 8 | 20.25 | — |
| Example 9 | 16.2 | — |
| Example 10 | 24.8 | — |
| Comparative Example 1 | 1.5 | 560 |
| Comparative Example 2 | 2.1 | 750 |
| Comparative Example 3 | 4.57 | 1,200 |
| Comparative Example 4 | 0.1 | 0.0 |
| Comparative Example 5 | 0.0 | 0.0 |
| Comparative Example 6 | 0.0 | 0.0 |
| Comparative Example 7 | 0.0 | 0.0 |

As shown in Table 2, the compositions prepared in Examples 1 to 10 according to embodiments of the present invention exhibited relatively high etching rates of the silicon carbonitride film. On the other hand, the compositions prepared in Comparative Examples 1 to 7 exhibited very low etching rates of the silicon carbonitride film. In addition, the compositions prepared in Examples 1 and 2 had etching rates of the carbon-doped silicon oxide film substantially higher than those of the compositions prepared in Comparative Examples 1 to 7.

Particularly, the compositions including both the first oxidizing agent and the second oxidizing agent prepared in Examples 1 to 10 had substantially enhanced etching rates of the silicon carbonitride film compared with those of the compositions prepared in Comparative Examples 1 to 3. The compositions prepared in Comparative Examples 1 to 3 did not include the first oxidizing agent and/or the second oxidizing agent, or included substantially different amounts of the second oxidizing agent. The compositions prepared in Comparative Examples 1 and 2 are disclosed in Japanese Laid-Open Patent Publication No. 2005-167181. However, it may be confirmed that the compositions prepared in Comparative Examples 1 and 2 exhibited a very low etching rate of the silicon carbonitride film, and exhibited etching rates of the carbon-doped silicon oxide film which were substantially lower than those of the compositions prepared in Examples 1 and 2. Furthermore, the compositions prepared in Comparative Examples 4 to 6 are used as conventional etching solutions. It may be noted that the compositions prepared in Comparative Examples 4 to 6 only minimally etched the silicon carbonitride film and the carbon-doped silicon oxide film.

With regard to the compositions prepared in Examples 1 and 2, the etching rates of the silicon carbonitride film were relatively lower than the etching rates of the carbon-doped silicon oxide film. Thus, it may be confirmed that the silicon carbonitride film is not easily removed when compared with the carbon-doped silicon oxide film.

Figure 5:
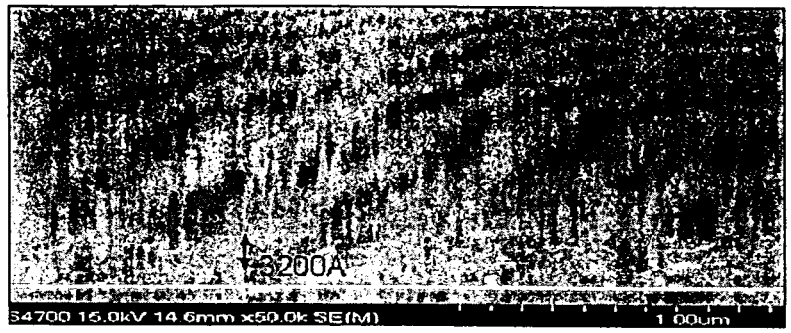
FIG. 5 is an SEM picture showing a cross section of a substrate on which a silicon carbonitride (SiCN) film is formed.
Figure 6:
FIG. 6 is an SEM picture showing a cross section of a substrate from which an insulation film was removed using the composition prepared in Example 1.

FIG. 5 is an SEM picture showing a cross section of a substrate on which a silicon carbonitride film is formed, and FIG. 6 is an SEM picture showing a cross section of a substrate from which an insulation film was removed using the composition prepared in Example 1.

Referring to FIGS. 5 and 6, the silicon carbonitride film having a thickness of about 3,200 Å was formed on a silicon wafer. After the silicon carbonitride film was etched using the composition prepared in Example 1 for about 125 minutes, the silicon carbonitride film was completely removed from the silicon wafer. Therefore, it may be confirmed that a composition according to embodiments of the present invention is effective in removing an insulation material such as silicon carbonitride.

Evaluation of Damage to a Silicon Wafer

Damage to a silicon wafer in an etching process was evaluated using the compositions prepared in Examples 1 to 13 and Comparative Examples 1 to 3.

A silicon carbonitride film was formed on the silicon wafer by processes substantially the same as those in evaluation of an etching rate of an insulation layer, and then removed from the silicon wafer using the compositions prepared in Examples 1 to 13 and Comparative Examples 1 to 3. Confirmation of whether the silicon wafer was damaged in the etching process was performed using naked eye observations. The results are shown in Table 3, where "X" denotes no damage (or substantially no damage) to the silicon wafer, and "O" denotes damage to the wafer.

TABLE 3

|  | Damage to a Silicon Wafer |
| --- | --- |
| Example 1 | X |
| Example 2 | X |
| Example 3 | X |
| Example 4 | X |
| Example 5 | X |
| Example 6 | X |
| Example 7 | X |
| Example 8 | X |
| Example 9 | X |
| Example 10 | X |
| Example 11 | O |
| Example 12 | O |
| Example 13 | O |
| Comparative Example 1 | O |
| Comparative Example 2 | O |
| Comparative Example 3 | X |

As shown in Table 3, the compositions prepared in Examples 1 to 10 did not substantially damage the silicon wafer in the etching process. The compositions did not damage both sides of the silicon wafer that included a front side from which the silicon carbonitride film was removed, and a backside of the silicon wafer. However, the compositions prepared in Comparative Examples 1 and 2 damaged the silicon wafer. In addition, the compositions prepared in Examples 11 to 13 slightly damaged the silicon wafer. The compositions prepared in Examples 11 to 13 did not include hydrogen peroxide as the first oxidizing agent. Therefore, it may be noted that the composition including hydrogen peroxide as the first oxidizing agent advantageously prevents the silicon wafer from being damaged.

Evaluation of an Etching Rate Depending on a Temperature Variation

An etching rate of a silicon carbonitride film relative to temperature variation was evaluated using the compositions prepared in Examples 1 and 2.

The etching rate was measured by processes substantially the same as those in the evaluation of the etching rate of the insulation layer except that the temperature of the composition was changed in a range of about 40° C. to about 60° C.

Figure 7:
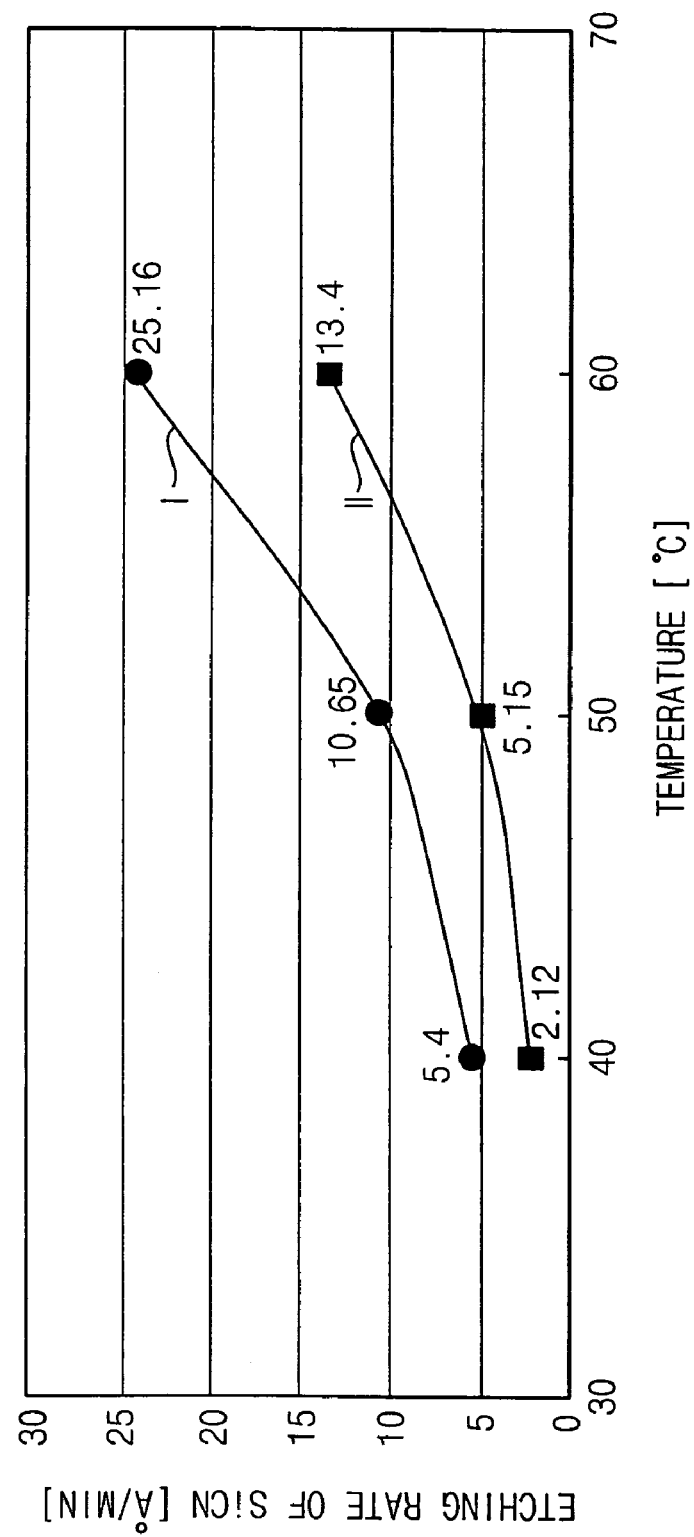
FIG. 7 is a graph showing an etching rate of a silicon carbonitride (SiCN) film depending on temperature for the compositions prepared in Examples 1 and 2.

FIG. 7 is a graph showing the etching rate of the silicon carbonitride film relative to temperature variation for the compositions prepared in Examples 1 and 2. In FIG. 7, "I" is a graph showing the etching rate of the silicon carbonitride film for the composition prepared in Example 1, and "II" is a graph showing the etching rate of the silicon carbonitride film for the composition prepared in Example 2.

Referring to FIG. 7, the compositions prepared in Examples 1 and 2 exhibited relatively low etching rates of about 5.4 Å/min and about 2.12 Å/min, respectively, when the temperature of the compositions was about 40° C. However, when the temperature of the compositions was about 60° C., the compositions prepared in Examples 1 and 2 exhibited relatively high etching rates of about 25.16 Å/min and about 13.4 Å/min, respectively. Therefore, it may be confirmed that the etching rate of the silicon carbonitride film may be controlled by changing the temperature of the composition.

Evaluation of an Etching Rate Depending on a Type of a Second Oxidizing Agent

An etching rate of an insulation layer relative to the type of a second oxidizing agent was evaluated using the compositions prepared in Examples 1 and 2. The composition prepared in Example 1 included about 30 percent by weight of sulfuric acid and about 10 percent by weight of acetic acid as the second oxidizing agents, and the composition prepared in Example 2 included about 40 percent by weight of sulfuric acid as the second oxidizing agent.

The etching rate was evaluated by processes substantially the same as those in the evaluation of the etching rate of the insulation layer.

Referring again to Table 2 and FIG. 7, the composition prepared in Example 1 exhibited etching rates of the silicon carbonitride film and the carbon-doped silicon oxide film were twice as high as those of the composition prepared in Example 2. Thus, it may be noted that the composition including both an inorganic acid and an organic acid as the second oxidizing agents has an enhanced etching rate of the insulation layer when compared with that of the composition including only an inorganic acid as the second oxidizing agent.

Evaluation of Stability of a Composition Depending on Presence or Absence of a Stabilizing Agent The stability of a composition depending on the presence or absence of a stabilizing agent was evaluated using the compositions prepared in Examples 1 and 10. The stability of a composition was evaluated by measuring an etching rate of a silicon carbonitride film with the passage of time.

The silicon carbonitride film was formed on a silicon wafer by processes substantially the same as those utilizaed in evaluation of an etching rate of an insulation layer, and then etched from the silicon wafer using the compositions prepared in Examples 1 and 10. An etching rate of the silicon carbonitride film was measured with the passage of a process time.

Figure 8:
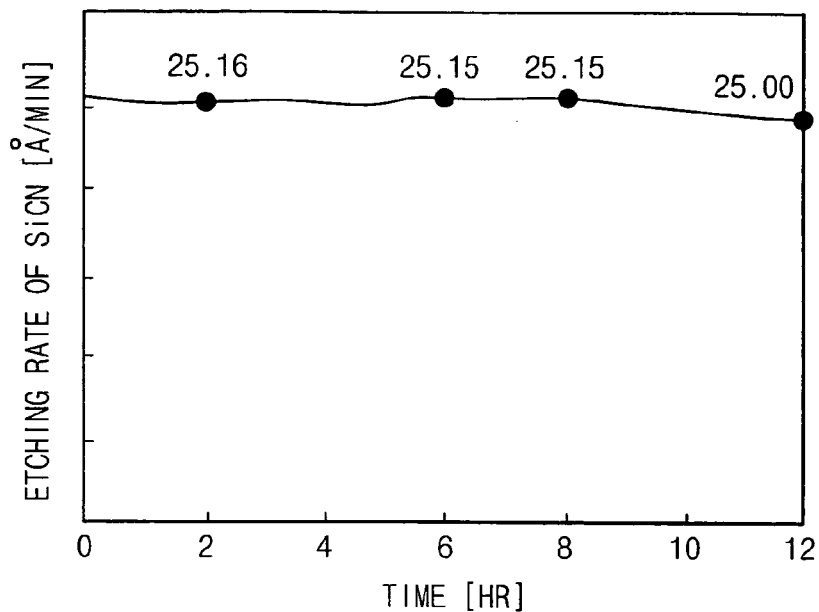
FIG. 8 is a graph showing an etching rate of a silicon carbonitride film depending on the passage of a process time for the composition prepared in Example 1.
Figure 9:
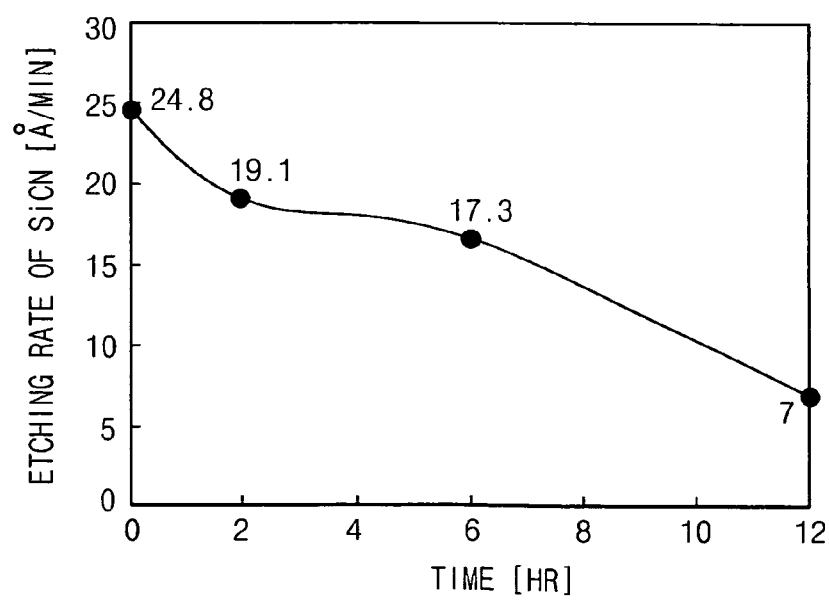
FIG. 9 is a graph showing an etching rate of a silicon carbonitride film depending on the passage of a process time for the composition prepared in Example 10.

FIG. 8 is a graph showing an etching rate of a silicon carbonitride film relative to the passage of a process time for the composition prepared in Example 1, and FIG. 9 is a graph showing an etching rate of a silicon carbonitride film relative to the passage of a process time for the composition prepared in Example 10.

Referring to FIGS. 8 and 9, the composition including the stabilizing agent prepared in Example 1 had an etching rate of the silicon carbonitride film which was constantly maintained for a relatively long time period. The composition not including the stabilizing agent prepared in Example 10 had good etching rate at the early stage. However, the etching rate of the silicon carbonitride film was greatly reduced as the process time elapsed. Therefore, it may be confirmed that the composition including the stabilizing agent exhibits enhanced stability with the passage of a process time.

According to the present invention, the composition may effectively remove an insulation layer such as a low-k film and a passivation film from a substrate. The substrate may be economically recycled by removing the insulation layer from the substrate using the composition. The insulation layer may be removed by a wet etching process so that damage to a substrate otherwise generated by a dry etching process may be prevented or reduced. Furthermore, the recycling of a substrate may be performed at a relatively low cost. Therefore, a process efficiency of a semiconductor manufacturing process may be enhanced and a manufacturing cost may be lowered.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of removing an insulation layer from an object, the method comprising:
   providing a composition; and
   applying the composition to the insulation layer to remove the insulation layer,
   wherein the insulation layer includes at least silicon carbonitride (SiCN), and
   wherein the composition comprises:
   about 5 to about 20 percent by weight of a first fluorine compound including hydrogen fluoride;
   about 1 to about 20 percent by weight of a second fluorine compound including ammonium hydrogen difluoride;
   about 0.01 to about 20 percent by weight of a first oxidizing agent including hydrogen peroxide and nitric acid;
   about 10 to about 50 percent by weight of a second oxidizing agent including sulfuric acid and an organic acid; and
   a remaining water.

2. The method of claim 1, wherein the insulation layer further comprises a low-k film including a low-k material.

3. The method of claim 2, wherein the insulation layer comprises the low-k film and a passivation film formed on the low-k film, and wherein the passivation film includes at least silicon carbonitirde (SiCN).

4. The method of claim 3, wherein the low-k film comprises carbon-doped silicon oxide (SiOCH) and the passivation film comprises silicon carbonitride (SiCN).

5. The method of claim 2, wherein the low-k material comprises at least one selected from the group consisting of carbon-doped silicon oxide (SiOCH), silicon oxycarbide (SiOC) and hydrogeneated silicon oxide (SiOH).

6. The method of claim 1, wherein the composition is applied to the insulation layer at a temperature of about 40° C. to about 90° C.

7. The method of claim 1, wherein the insulation layer further comprises at least carbon-doped silicon oxide (SiOCH).

8. The method of claim 1, wherein the insulation layer further comprises at least one selected from the group consisting of silicon nitride (SiN) and silicon carbide (SiC).

9. The method of claim 1, wherein the second oxidizing agent further comprises at least one inorganic acid selected from the group consisting of sulfuric acid, hydrochloric acid and phosphoric acid; and at least one organic acid selected from the group consisting of propionic acid, butyric acid, oxalic acid, malonic acid, maleic acid, succinic acid, glutaric acid, adipic acid, phthalic acid and fumaric acid.

10. The method of claim 1, wherein the composition further comprises about 1 to about 20 percent by weight of a stabilizing agent including an amide compound, an amine compound or a combination thereof.

11. The method of claim 10, wherein the amide compound comprises at least one selected from the group consisting of carbamide and acetamide, and the amine compound comprises at least one selected from the group consisting of methylamine, diethylamine, n-decylamine, morpholine, allylamine, triethylenediamine, dimethylcyclohexylamine, triethylamine and dimethylethanolamine.

12. A method of recycling a substrate comprising:
   forming an insulation layer on the substrate, the insulation layer including at least silicon carbonitride (SiCN); and
   removing the insulation layer from the substrate by applying a composition to the insulation layer,
   wherein the composition comprises:
   about 5 to about 20 percent by weight of a first fluorine compound including hydrogen fluoride;
   about 1 to about 20 percent by weight of a second fluorine compound including ammonium hydrogen difluoride;
   about 0.01 to about 20 percent by weight of a first oxidizing agent including hydrogen peroxide and nitric acid;
   about 10 to about 50 percent by weight of a second oxidizing agent including sulfuric acid and an organic acid; and
   a remaining water.

13. The method of claim 12, wherein the insulation layer comprises a low-k film including a low-k material and a passivation film including the passivation material formed on the low-k film, and wherein the passivation film includes silicon carbonitride (SiCN), or a multi-layered film including the low-k film and the passivation film.

14. A method of removing an insulation layer from an object, the method comprising:
   providing a composition which includes about 5 to about 20 percent by weight of a first fluorine compound including hydrogen fluoride, about 1 to about 20 percent by weight of a second fluorine compound including ammonium hydrogen difluoride, about 0.01 to about 20 percent by weight of a first oxidizing agent, about 10 to about 50 percent by weight of a second oxidizing agent, and a remaining water; and
   applying the composition to the insulation layer to remove the insulation layer,
   wherein the insulation layer comprises at least silicon carbonitride (SiCN), and
   wherein the second oxidizing agent comprises sulfuric acid and acetic acid.

* * * * *